(12) United States Patent
Lee

(10) Patent No.: US 12,237,206 B2
(45) Date of Patent: *Feb. 25, 2025

(54) DEVICE FOR ETCHING THE PERIPHERY EDGE OF A SUBSTRATE

(71) Applicant: DEVICEENG CO., LTD., Chungcheongnam-do (KR)

(72) Inventor: Taek Youb Lee, Chungcheongnam-do (KR)

(73) Assignee: DEVICEENG CO., LTD., Chungcheongnam-do (KR)

( * ) Notice: Subject to any disclaimer, the term of this patent is extended or adjusted under 35 U.S.C. 154(b) by 373 days.

This patent is subject to a terminal disclaimer.

(21) Appl. No.: 17/729,036

(22) Filed: Apr. 26, 2022

(65) Prior Publication Data

US 2023/0268221 A1 Aug. 24, 2023

(30) Foreign Application Priority Data

Feb. 21, 2022 (KR) .......................... 10-2022-0022444

(51) Int. Cl.
*H01L 21/687* (2006.01)
*H01L 21/67* (2006.01)

(52) U.S. Cl.
CPC .. *H01L 21/68785* (2013.01); *H01L 21/67075* (2013.01); *H01L 21/68792* (2013.01)

(58) Field of Classification Search
None
See application file for complete search history.

(56) References Cited

U.S. PATENT DOCUMENTS

| 7,018,555 B2 * | 3/2006 | Shimbara | G11B 23/505 156/345.55 |
| 7,241,362 B2 * | 7/2007 | Shimbara | G11B 23/505 156/345.55 |
| 8,821,681 B2 * | 9/2014 | Puggl | H01L 21/67051 156/345.55 |
| 2008/0128088 A1 | 6/2008 | Junn et al. | |

(Continued)

FOREIGN PATENT DOCUMENTS

| JP | 2000133625 A | 5/2000 |
| KR | 1020070109635 A | 11/2007 |
| KR | 1020110116467 A * | 10/2011 |

OTHER PUBLICATIONS

Machine Generated English Translation of KR101394092B1. Published May 13, 2014. (Year: 2014).*

*Primary Examiner* — Sylvia Macarthur
(74) *Attorney, Agent, or Firm* — BLANK ROME LLP

(57) ABSTRACT

The present invention relates to a substrate edge etching apparatus including: a substrate support assembly having a horizontally rotatable chuck base, chuck pins disposed on top of the chuck base, a purge gas inlet hole extending from an underside center of the chuck base to an interior of the chuck base, and a purge gas outlet hole extending radially from the purge gas inlet hole and then extending upwardly to penetrate top of the chuck base; a spin motor having a hollow tube-shaped driving shaft adapted to rotate the substrate support assembly; and a purge gas supply assembly connected to the driving shaft through a magnetic bearing in a state of not rotating, extending vertically from the underside center of the chuck base in a state of being spaced apart from an underside of the chuck base.

5 Claims, 7 Drawing Sheets

(56) References Cited

U.S. PATENT DOCUMENTS

| | | | |
|---|---|---|---|
| 2015/0187612 A1* | 7/2015 | Obweger | H01L 21/67126 |
| | | | 216/84 |
| 2016/0064242 A1* | 3/2016 | Obweger | H01L 21/6708 |
| | | | 134/1 |
| 2017/0148652 A1* | 5/2017 | Hipp | H01L 21/68785 |
| 2017/0162426 A1* | 6/2017 | Gleissner | H01L 21/67115 |
| 2017/0323823 A1* | 11/2017 | Si | H01L 21/67115 |
| 2018/0047596 A1* | 2/2018 | Si | H01L 21/67034 |
| 2018/0182645 A1* | 6/2018 | Nakano | H01L 21/67051 |
| 2019/0390337 A1 | 12/2019 | Mustafa et al. | |
| 2023/0268201 A1* | 8/2023 | Lee | H01L 21/67259 |
| | | | 118/722 |
| 2023/0268221 A1* | 8/2023 | Lee | H01L 21/68785 |
| | | | 156/345.1 |
| 2023/0269881 A1* | 8/2023 | Lee | H05K 3/068 |
| | | | 216/96 |

* cited by examiner

PRIOR ART

DEVICE FOR ETCHING THE PERIPHERY EDGE OF A SUBSTRATE

CROSS REFERENCE TO RELATED APPLICATION OF THE INVENTION

The present application claims the benefit of Korean Patent Application No. 10-2022-0022444 filed in the Korean Intellectual Property Office on Feb. 21, 2022, the entire contents of which are incorporated herein by reference.

BACKGROUND OF THE INVENTION

Field of the Invention

The present invention relates to a substrate edge etching apparatus, and more specifically, to a substrate edge etching apparatus that is capable of etching a peripheral edge of a substrate by means of the application of a chemical liquid thereto in a state where a treatment surface of the substrate, on which a circuit pattern is formed, is facingly placed on top thereof.

Background of the Related Art

Generally, a process of forming a circuit pattern on a substrate includes various steps such as oxidation, photolithography, etching, deposition, metallization, and the like, which are performed on one surface of the substrate.

While such steps are being performed, all kinds of foreign substances are attached to a peripheral edge of the substrate to the form of layers.

Accordingly, the peripheral edge of the substrate cannot be utilized in forming the circuit pattern, and of course, it actually has no circuit pattern formed thereon.

If the peripheral edge of the substrate is fixed by chuck pins to perform the circuit pattern formation process, however, the layers of foreign substances attached to the peripheral edge of the substrate may be cracked, so that the foreign substances may enter the inside of the substrate, and otherwise, particles generated from the foreign substances may invade the inside of the substrate, thereby making it difficult to form the circuit pattern on the substrate.

To prevent such problems from occurring, there is a need to in advance etch and remove the layers of foreign substances formed on the peripheral edge of the substrate.

FIG. 1A schematically shows a process of etching an edge of a substrate.

FIG. 1B shows a representative process of etching a peripheral edge of a substrate, and the conventional substrate edge etching process is carried out by reversely positioning a substrate 10 on a chuck base 20 to thus allow a treatment surface of the substrate 10, on which a circuit pattern formation layer 11 is formed, to be facingly placed on top of the chuck base 20, and then supplying a chemical liquid to top of the substrate 10 and a purge gas such as nitrogen gas (N2) to an underside of the substrate 10 to perform purging.

If the chemical liquid is supplied to top of the substrate 10, the chemical liquid somewhat enters a radial inside of the substrate 10 from the periphery of the substrate 10 by means of surface tension thereof and is then discharged to the outside of the substrate 10, so that the etching of the peripheral edge of the substrate is performed.

The purge gas is a gas supplied to prevent particles in the air from entering the circuit pattern formation layer 11 of the substrate 10, and representatively, an inert gas such as N2 may be used as the purge gas.

In the conventional practice, as shown, when the purge gas is exhausted to a radial outside of a substrate support assembly 40 through a purge gas pipe 30 disposed on the center of the substrate support assembly 40, grease or fine particles generated from a bearing 20 or particles in the air may enter, so that the surface of the substrate 10 may be damaged (See radial defects as shown in FIG. 2A).

Further, a negative pressure is generated from a space between the substrate 10 and the substrate support assembly through the outward flow of N2 caused by the rotations of the substrate 10 and the substrate support assembly 40, and accordingly, the substrate 10 may be deformed downward. Further, the self weight of the substrate 10 is added to cause the substrate 10 to sag down and come into close contact with the substrate support assembly 40, and besides, the particles stay in the space due to the negative pressure generated to thus cause the substrate 10 to be damaged (See center collection defects as shown in FIG. 2B).

As a quantity of motion of the chemical liquid on top of the substrate 10 toward the radial outside of the substrate 10 is small, further, the chemical liquid excessively enters the radial inside of the substrate 10 to thus cause partial overetching in a circumferential direction of the substrate 10, thereby making it hard to form a circuit pattern on the substrate 10 (See chemical liquid invasive over-etching defects as shown in FIG. 2C).

SUMMARY OF THE INVENTION

Accordingly, the present invention has been made in view of the above-mentioned problems occurring in the related art, and it is an object of the present invention to provide a substrate edge etching apparatus that is capable of preventing foreign substances such as particles from entering a substrate while a purge gas is being exhausted, thereby avoiding substrate surface damage due to the foreign substances.

It is another object of the present invention to provide a substrate edge etching apparatus that is capable of preventing a negative pressure from being generated from a space between a substrate and a substrate support assembly during a substrate edge etching process, thereby avoiding substrate surface damage due to substrate sagging and particles staying in the space.

To accomplish the above-mentioned objects, according to the present invention, there is provided a substrate edge etching apparatus including: a substrate support assembly having a horizontally rotatable chuck base, chuck pins disposed on top of the chuck base to support a substrate, a purge gas inlet hole extending from an underside center of the chuck base to an interior of the chuck base in an upward and downward direction thereof, and a purge gas outlet hole extending radially from the purge gas inlet hole and then extending upwardly to penetrate top of the chuck base; a spin motor having a hollow tube-shaped driving shaft adapted to rotate the substrate support assembly; and a purge gas supply assembly connected to the driving shaft through a magnetic bearing in a state of not rotating, extending vertically from the underside center of the chuck base in a state of being spaced apart from an underside of the chuck base, and having a hollow hole penetratingly extending therealong in an upward and downward direction thereof to supply a purge gas to the purge gas inlet hole.

According to the present invention, desirably, the purge gas supply assembly may include: a purge gas guide tube spaced apart from a periphery of the purge gas inlet hole in a radial direction thereof to surround the periphery of the purge gas inlet hole in a plan view and having the hollow hole penetratingly extending in the upward and downward direction in a side view; and a hollow tube-shaped purge gas guide tube support shaft spacedly overlaid onto top of the purge gas guide tube in an outer radial direction of the purge gas guide tube and adapted to mount the magnetic bearing thereonto to support the driving shaft.

According to the present invention, desirably, the chuck base has a purge gas introduction tube extending downward from the underside thereof to communicate with the purge gas inlet hole, the purge gas introduction tube being disposed spaced apart from the purge gas guide tube inside the purge gas guide tube in a radial direction thereof, and a path formed between the purge gas introduction tube and the purge gas guide tube, a path formed between the underside of the chuck base and the top end of the purge gas guide tube, and a path formed between the purge gas guide tube support shaft and the driving shaft may provide a first purge gas exhaust path.

According to the present invention, desirably, the purge gas guide tube may have a plurality of communication holes spaced apart from one another on an upper surface thereof in a circumferential direction thereof, and the path formed between the purge gas guide tube and the purge gas introduction tube, the communication holes, and a path formed between the purge gas guide tube and the purge gas guide tube support shaft may provide a second purge gas exhaust path.

According to the present invention, desirably, in a plan view, the chuck base may have a bypass path formed on a center of top thereof to communicate with the purge gas outlet hole.

According to the present invention, desirably, in a longitudinal sectional view, the chuck base may include an inside part and an outside part with respect to the purge gas outlet hole, the inside part being lower in height than the outside part.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1A:
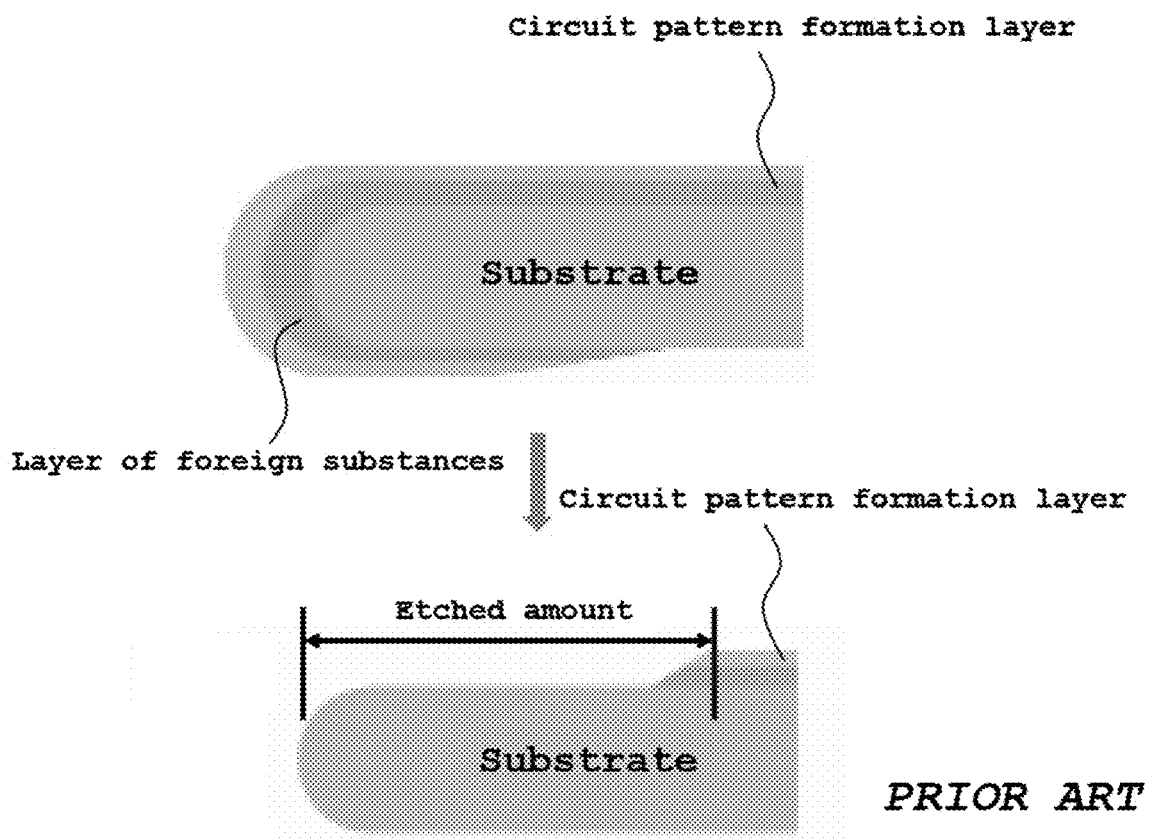
FIG. 1A is a schematic view showing a process of etching an edge of a substrate.
Figure 1B:
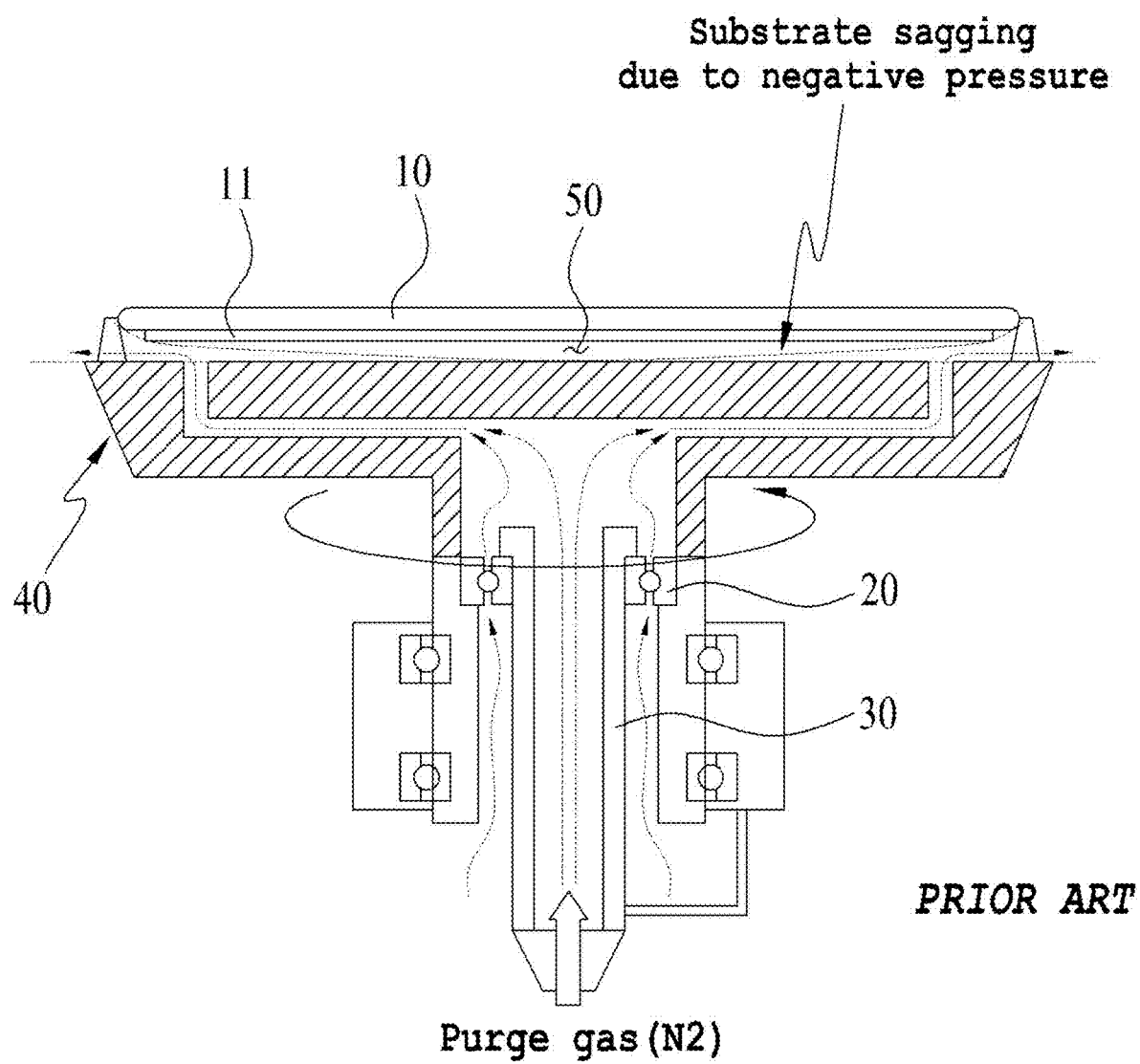
FIG. 1B is a longitudinal sectional view showing a substrate edge etching apparatus according to a conventional technology.
Figure 2A:
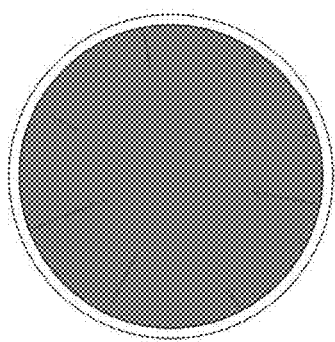
FIGS. 2A to 2C are top views showing defects on substrates that occur in the substrate edge etching apparatus according to the conventional technology.
Figure 2B:
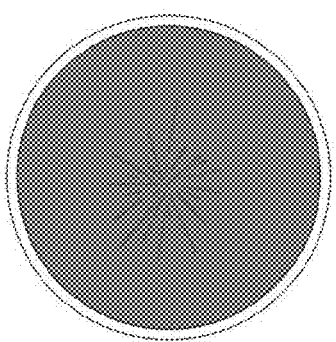
Figure 2C:
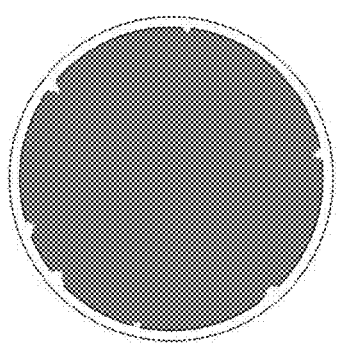
Figure 3:
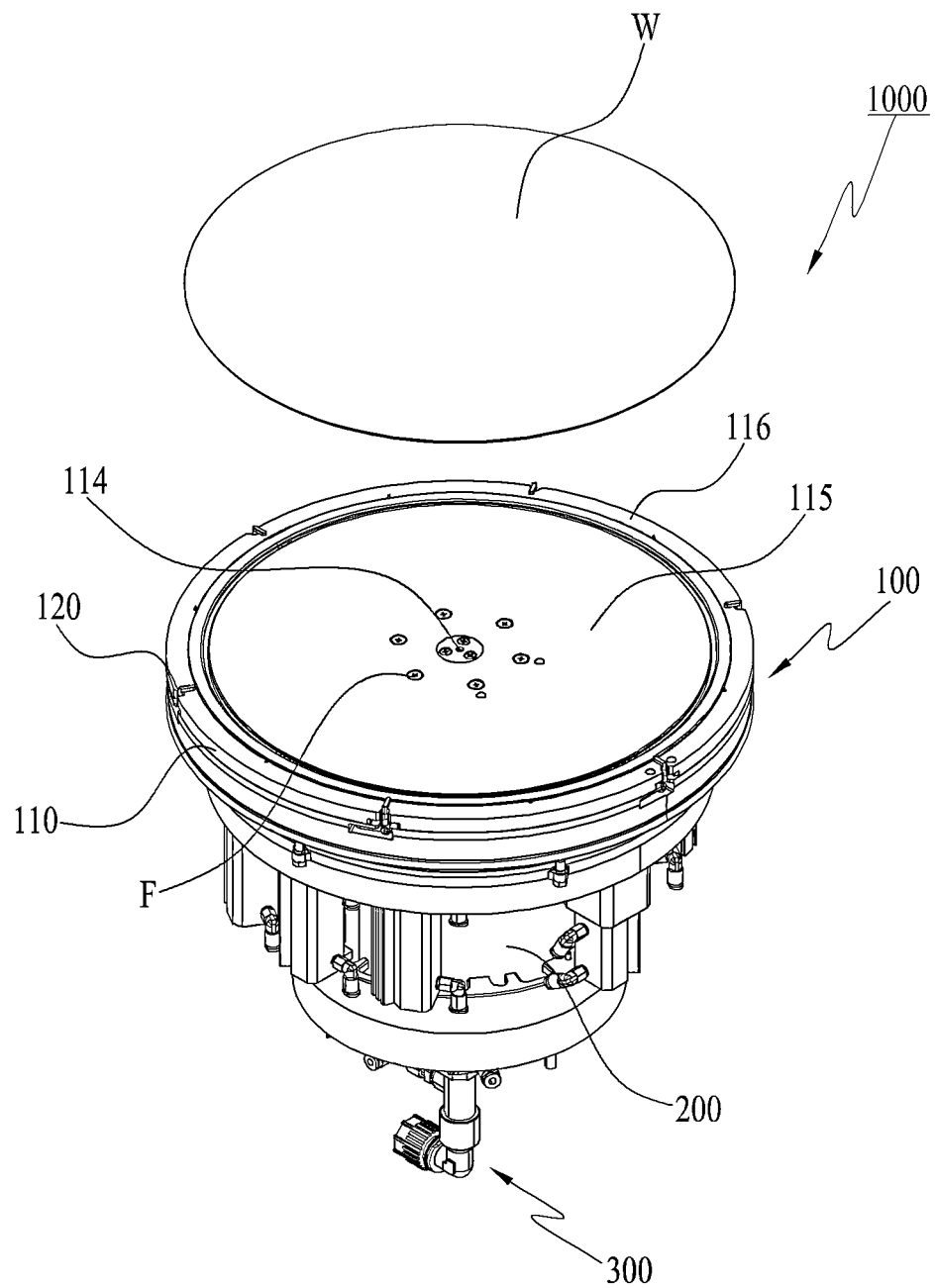
FIG. 3 is a perspective view showing a substrate edge etching apparatus according to the present invention.
Figure 4:
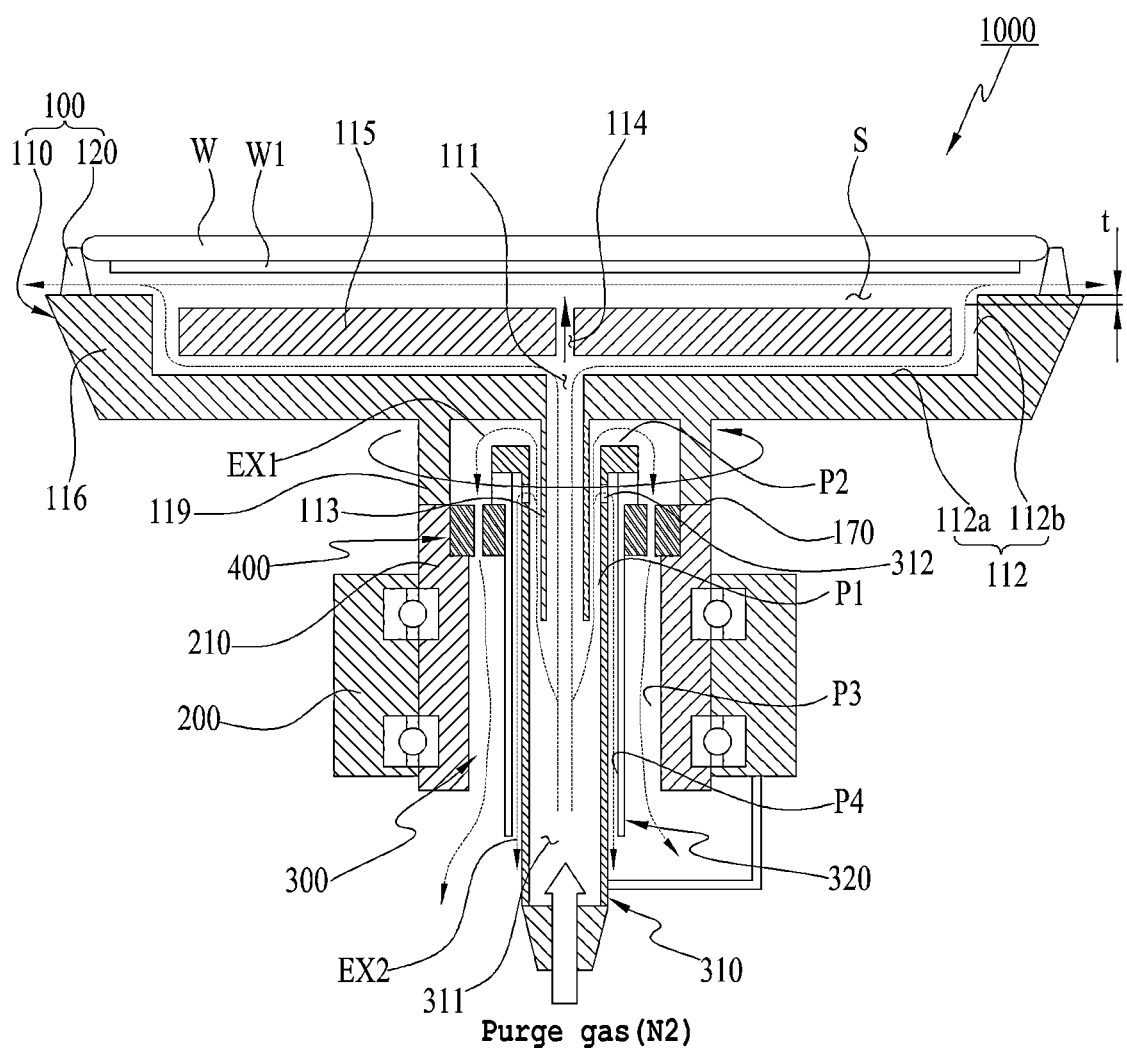
FIG. 4 is a longitudinal sectional view showing the substrate edge etching apparatus according to the present invention.

As shown in FIGS. 3 and 4, a substrate edge etching apparatus 1000 includes: a substrate support assembly 100 having a horizontally rotatable chuck base 110, chuck pins 120 disposed on top of the chuck base 110 to support a substrate W, a purge gas inlet hole 111 extending from an underside center of the chuck base 110 to an interior of the chuck base 110 in an upward and downward direction thereof, and a purge gas outlet hole 112 extending radially from the purge gas inlet hole 111 and then extending upwardly to penetrate top of the chuck base 110; a spin motor 200 having a hollow tube-shaped driving shaft 210 adapted to rotate the substrate support assembly 100; and a purge gas supply assembly 300 connected to the driving shaft 210 through a magnetic bearing 400 in a state of not rotating, extending vertically from the underside center of the chuck base 110 in a state of being spaced apart from an underside of the chuck base 110, and having a hollow hole 311 penetratingly extending therealong in an upward and downward direction thereof to supply a purge gas to the purge gas inlet hole 111.

Like this, the driving shaft 210 is rotatably supported against the purge gas supply assembly 300 by means of the magnetic bearing 400, and accordingly, no particles are generated from the magnetic bearing 400 itself, which prevents the substrate W from being damaged.

In specific, the purge gas supply assembly 300 includes a purge gas guide tube 310 spaced apart from a periphery of the purge gas inlet hole 111 in a radial direction thereof to surround the periphery of the purge gas inlet hole 111 in a plan view and having the hollow hole 311 penetratingly extending in the upward and downward direction thereof in a side view and a hollow tube-shaped purge gas guide tube support shaft 320 spacedly overlaid onto top of the purge gas guide tube 310 in an outer radial direction of the purge gas guide tube 310 and adapted to mount the magnetic bearing 400 thereonto to support the driving shaft 210.

Under the above-mentioned configuration, the purge gas such as N2 and the like is introduced through the purge gas guide tube 310. Next, a given amount of the purge gas is exhausted through the purge gas inlet hole 111 and the purge gas outlet hole 112 formed on the chuck base 110 to a space between the substrate W and top of the chuck base 110, and simultaneously, the rest of the purge gas is exhausted to the outside in a direction distant from the substrate W through a path between the purge gas inlet hole 111 and the purge gas guide tube 310 and the magnetic bearing 400, so that external particles are prevented from entering the substrate W through the magnetic bearing 400.

In specific, the chuck base 110 has a purge gas introduction tube 113 extending downward from the underside thereof to communicate with the purge gas inlet hole 111, and if the purge gas introduction tube 113 is disposed spaced apart from the purge gas guide tube 310 inside the purge gas guide tube 310 in a radial direction thereof, the path through which the rest of the purge gas passes can be clearly defined, so that a flow rate of the purge gas is introduced dividedly in a relatively accurate way.

Figure 5:
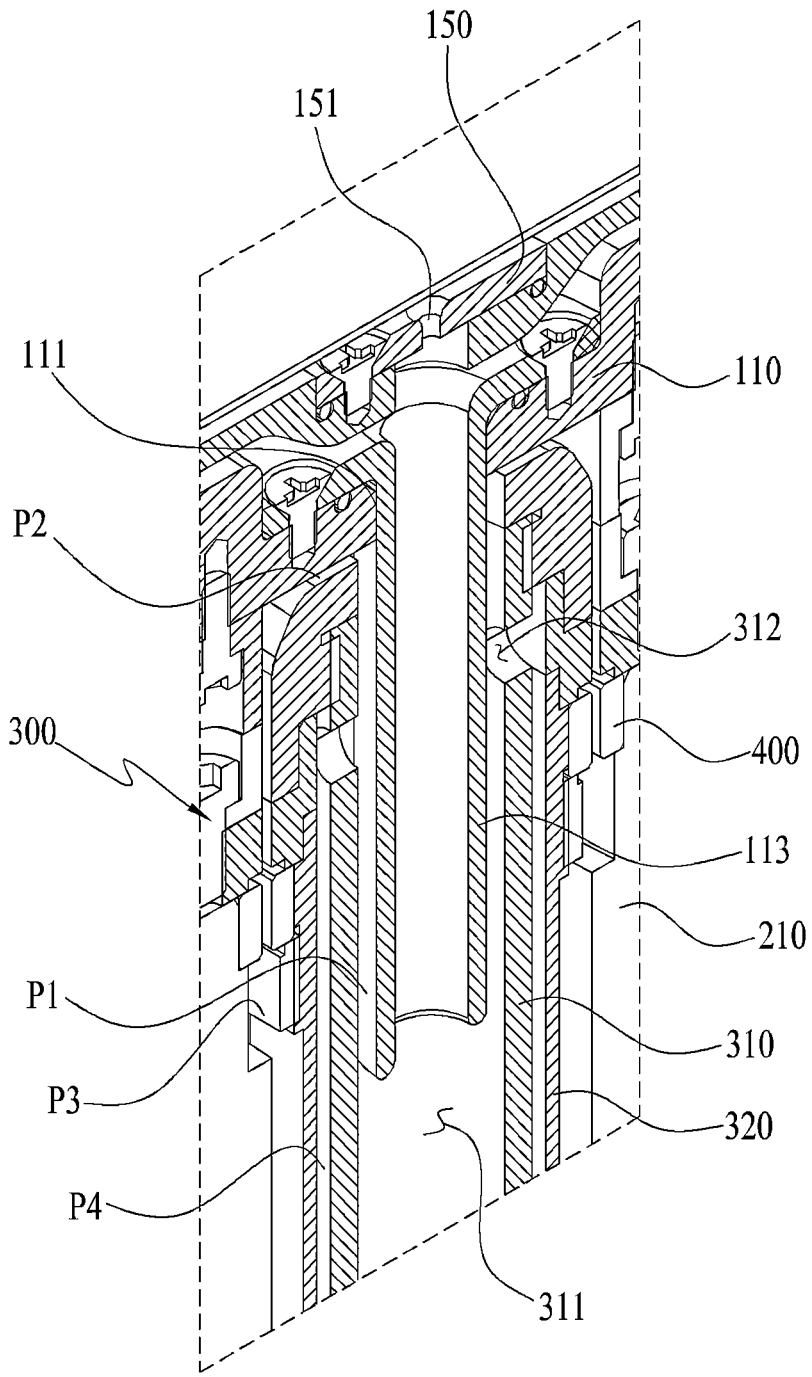
FIG. 5 is a longitudinal perspective sectional view showing a portion of a substrate edge etching apparatus according to another embodiment of the present invention.

The purge gas introduction tube 113 is formed unitarily with the chuck base 110, but as shown in FIG. 5, the purge gas introduction tube 113 may be configured to allow a top end periphery thereof to extend radially so that it can be detachably coupled to the chuck base 110.

Under the above-mentioned configuration, a path P1 formed between the purge gas introduction tube 113 and the purge gas guide tube 310, a path P2 formed between the underside of the chuck base 110 and the top end of the purge gas guide tube 310, and a path P3 formed between the purge gas guide tube support shaft 320 and the driving shaft 210 provide a first purge gas exhaust path EX1.

As the purge gas is exhausted to the outside through the first purge gas exhaust path EX1, a flow of external air is not introduced into a purge area through the magnetic bearing 400, thereby preventing a circuit pattern formation layer W1 of the substrate W from being damaged and easily discharging the particles introduced through a connecting part 170 between the driving shaft 210 and the chuck base 110 to the outside.

Further, the chuck base 110 has a hollow pipe-shaped connection shaft 119 disposed on the underside thereof so that it can be connected to the driving shaft 210 through the connecting part 170.

In a plan view, the purge gas introduction tube 113, the purge gas guide tube 310, the purge gas guide tube support shaft 320, and the driving shaft 210 desirably form concentric circles to thus have uniform radial distances along their circumferential direction.

Further, the purge gas guide tube 310 has a plurality of communication holes 312 spaced apart from one another on an upper peripheral surface thereof in a circumferential direction thereof, and accordingly, the path P1 formed between the purge gas guide tube 310 and the purge gas introduction tube 113, the communication holes 312, and a path P4 formed between the purge gas guide tube 310 and the purge gas guide tube support shaft 320 provide a second purge gas exhaust path EX2.

Under the above-mentioned configuration, the rest of the purge gas entering the path P1 between the purge gas guide tube 310 and the purge gas introduction tube 113 excepting a given amount of the purge gas passing through the first purge gas exhaust path EX1 is exhausted through the second purge gas exhaust path EX2, so that it is possible to completely discharge foreign substances remaining between the purge gas guide tube 310 and the purge gas guide tube support shaft 320.

While the chuck base 110 is rotating, in specific, a pressure around a connected portion between the purge gas guide tube 310 and the purge gas guide tube support shaft 320 becomes decreased to prevent particles in the flow of external air from entering through a minute gap occurring in a coupled structure between the purge gas guide tube 310 and the purge gas guide tube support shaft 320.

In a plan view, further, the chuck base 110 has a bypass path 114 formed on a center of top thereof to communicate with the purge gas outlet hole 112, thereby preventing a negative pressure from being generated from a space S between the chuck base 110 and the substrate W to keep the substrate W from sagging down toward the top of the chuck base 110 or to keep external particles from being collected to the space S.

Further, the chuck base 110 has a cover 150 disposed on the center thereof to cover the bypass path 114, and in this case, the cover 150 has a through hole 151 formed thereon to communicate with the bypass path 114.

Accordingly, the purge gas, which passes through the bypass path 114, is exhausted through the through hole 151 and moves in a radial direction of the substrate W to perform a purge function.

Further, in a longitudinal sectional view, the chuck base 110 is configured to have an inside part 115 and an outside part 116 with respect to the purge gas outlet hole 112, and in this case, the inside part 115 is lower in height than the outside part 116 (See a reference symbol 't' of FIG. 4). Accordingly, the substrate W can be prevented from sagging down and coming into contact with top of the inside part 115 of the chuck base 110.

Figure 6:
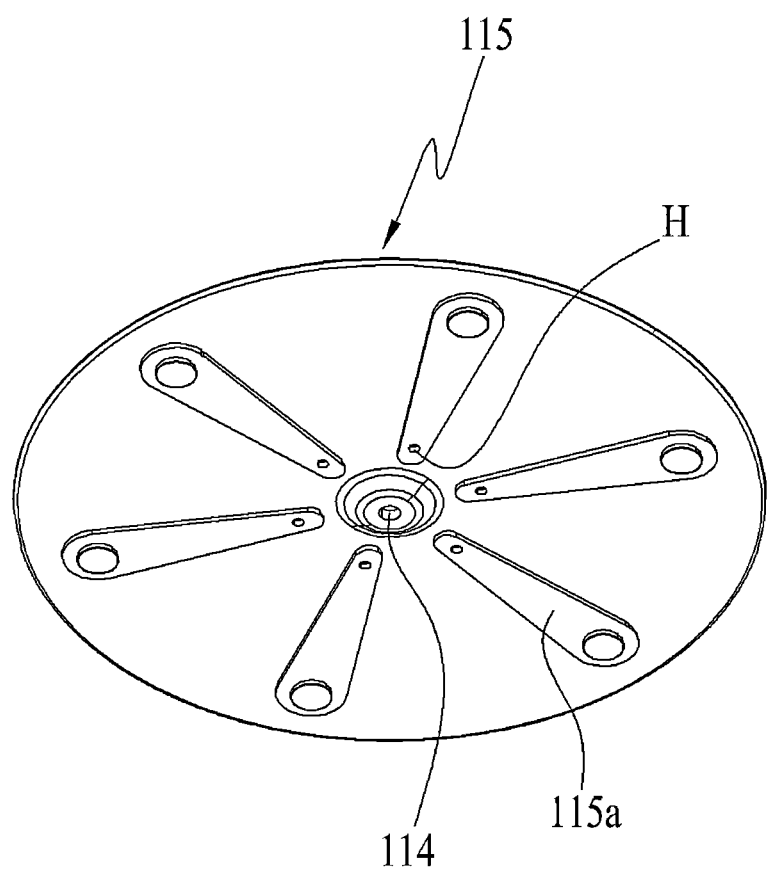
FIG. 6 is a bottom perspective view showing an example of an inside part in a case where a chuck base of the substrate edge etching apparatus according to the present invention is separated into the inside part and an outside part.

Further, as shown in FIGS. 3 and 6, the inside part 115 is separatedly provided from the outside part 116 and detachably fastened to the outside part 116 by means of fastening members F such as screws or bolts fitted to fastening holes H, and in this case, the inside part 115 has guide pieces 115a extending radially from the underside thereof.

As described above, the substrate edge etching apparatus according to the present invention is configured to have the substrate support assembly having the horizontally rotatable chuck base, the chuck pins disposed on top of the chuck base to support the substrate, the purge gas inlet hole extending from the underside center of the chuck base to the interior of the chuck base in the upward and downward direction thereof, and the purge gas outlet hole extending radially from the purge gas inlet hole and then extending upwardly to penetrate top of the chuck base, the spin motor having the hollow tube-shaped driving shaft adapted to rotate the substrate support assembly, and the purge gas supply assembly connected to the driving shaft through the magnetic bearing in a state of not rotating, extending vertically from the underside center of the chuck base in a state of being spaced apart from the underside of the chuck base, and having the hollow hole penetratingly extending therealong in the upward and downward direction thereof to supply the purge gas to the purge gas inlet hole, whereby the driving shaft is rotatably supported against the purge gas supply assembly by means of the magnetic bearing, and accordingly, no particles are generated from the magnetic bearing itself, which prevents the substrate from being damaged.

According to the present invention, further, the purge gas supply assembly is configured to have the purge gas guide tube spaced apart from the periphery of the purge gas inlet hole in the radial direction thereof to surround the periphery of the purge gas inlet hole in a plan view and having the hollow hole penetratingly extending in the upward and downward direction thereof in a side view and the hollow tube-shaped purge gas guide tube support shaft spacedly overlaid onto top of the purge gas guide tube in the outer radial direction of the purge gas guide tube and adapted to mount the magnetic bearing thereonto to support the driving shaft, whereby after the purge gas such as N2 and the like is introduced through the purge gas guide tube, a given amount of the purge gas is exhausted through the purge gas inlet hole and the purge gas outlet hole formed on the chuck base to the space between the substrate and top of the chuck base, and the rest of the purge gas is exhausted to the outside in a direction distant from the substrate through the path between the purge gas inlet hole and the purge gas guide tube and the magnetic bearing, so that external particles are prevented from being introduced into the substrate through the magnetic bearing.

According to the present invention, in addition, the chuck base is configured to have the purge gas introduction tube extending downward from the underside thereof to communicate with the purge gas inlet hole, the purge gas introduction tube being disposed spaced apart from the purge gas guide tube inside the purge gas guide tube in the radial direction thereof, and the path formed between the purge gas introduction tube and the purge gas guide tube, the path formed between the underside of the chuck base and the top end of the purge gas guide tube, and the path formed between the purge gas guide tube support shaft and the driving shaft provide the first purge gas exhaust path, so that as the purge gas is exhausted to the outside through the first purge gas exhaust path, external air is not introduced into a purge area through the magnetic bearing, thereby avoiding the damage on the circuit pattern formation layer of the substrate and easily discharging the particles introduced through the connecting part between the driving shaft and the chuck base to the outside.

According to the present invention, desirably, the purge gas guide tube is configured to have the plurality of communication holes spaced apart from one another on the upper surface thereof in the circumferential direction thereof, and the path formed between the purge gas guide tube and the purge gas introduction tube, the communication holes, and the path formed between the purge gas guide tube and the purge gas guide tube support shaft provide the second purge gas exhaust path, so that the rest of the purge gas entering the path between the purge gas guide tube and the purge gas introduction tube excepting a given amount of the purge gas passing through the first purge gas exhaust path is exhausted through the second purge gas exhaust path, thereby making it possible to completely discharge foreign matters introduced through the minute gap occurring in the coupled structure between the purge gas guide tube and the purge gas guide tube support shaft.

According to the present invention, moreover, in a plan view, the chuck base is configured to have the bypass path formed on a center of top thereof to communicate with the purge gas outlet hole, thereby preventing the negative pressure from being generated from the space between the chuck base and the substrate to keep the substrate from sagging down toward the top of the chuck base or to keep the external particles from being collected to the space.

According to the present invention, further, in a longitudinal sectional view, the chuck base is configured to have the inside part and the outside part with respect to the purge gas outlet hole, the inside part being lower in height than the outside part, so that the substrate can be prevented from sagging down and coming into contact with top of the inside part of the chuck base.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate edge etching apparatus comprising:
a substrate support assembly having a horizontally rotatable chuck base, chuck pins disposed on top of the chuck base to support a substrate, a purge gas inlet hole extending from an underside center of the chuck base to an interior of the chuck base in an upward and downward direction thereof, and a purge gas outlet hole extending radially from the purge gas inlet hole and then extending upwardly to penetrate top of the chuck base;

a spin motor having a hollow tube-shaped driving shaft adapted to rotate the substrate support assembly; and a purge gas supply assembly connected to the driving shaft through a magnetic bearing in a state of not rotating, extending vertically in a state of top of the purge gas supply assembly being spaced apart from an underside of the chuck base, and having a hollow hole penetratingly extending therealong in an upward and downward direction thereof and formed facing the purge gas inlet hole to supply purge gas to the purge gas inlet hole, wherein the purge gas discharged upward from the purge gas outlet hole through the purge gas inlet hole is supplied between the substrate and the top of the chuck base and flows outside the substrate edge, purge gas introduced between the top of the purge gas supply assembly and an underside of the chuck base is exhausted to the outside in a direction away from the substrate via the magnetic bearing, wherein, in a longitudinal sectional view, the chuck base comprises an inside part and an outside part with respect to the purge gas outlet hole, the inside part being lower in height than the outside part.

2. The substrate edge etching apparatus according to claim 1, wherein the purge gas supply assembly comprises:
a purge gas guide tube spaced apart from a periphery of the purge gas inlet hole in a radial direction thereof to surround the periphery of the purge gas inlet hole in a plan view and having the hollow hole penetratingly extending in the upward and downward direction in a side view; and
a hollow tube-shaped purge gas guide tube support shaft spacedly overlaid onto top of the purge gas guide tube in an outer radial direction of the purge gas guide tube and adapted to mount the magnetic bearing thereonto to support the driving shaft.

3. The substrate edge etching apparatus according to claim 2, wherein the chuck base has a purge gas introduction tube extending downward from the underside thereof to communicate with the purge gas inlet hole, the purge gas introduction tube being disposed spaced apart from the purge gas guide tube inside the purge gas guide tube in a radial direction thereof, and a path formed between the purge gas introduction tube and the purge gas guide tube, a path formed between the underside of the chuck base and the top end of the purge gas guide tube, and a path formed between the purge gas guide tube support shaft and the driving shaft provide a first purge gas exhaust path.

4. The substrate edge etching apparatus according to claim 3, wherein the purge gas guide tube has a plurality of communication holes spaced apart from one another on an upper surface thereof in a circumferential direction thereof, and the path formed between the purge gas guide tube and the purge gas introduction tube, the plurality of communication holes, and a path formed between the purge gas guide tube and the purge gas guide tube support shaft provide a second purge gas exhaust path.

5. The substrate edge etching apparatus according to claim 1, wherein in a plan view, the chuck base has a bypass path formed on a center of top thereof to communicate with the purge gas outlet hole.

\* \* \* \* \*